(12) United States Patent
Camras et al.

(10) Patent No.: US 7,276,737 B2
(45) Date of Patent: *Oct. 2, 2007

(54) LIGHT EMITTING DEVICES WITH IMPROVED LIGHT EXTRACTION EFFICIENCY

(75) Inventors: Michael D. Camras, Sunnyvale, CA (US); Gerard Harbers, Sunnyvale, CA (US); William R. Imler, Oakland, CA (US); Matthijs H. Keuper, San Jose, CA (US); Paul S. Martin, Pleasanton, CA (US); Douglas W. Pocius, Sunnyvale, CA (US); Frank M. Steranka, San Jose, CA (US); Helena Ticha, Srch (CZ); Ladislav Tichy, Srch (CZ); R. Scott West, Wixom, MI (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/328,964

(22) Filed: Jan. 9, 2006

(65) Prior Publication Data

US 2006/0118805 A1    Jun. 8, 2006

Related U.S. Application Data

(62) Division of application No. 10/633,054, filed on Jul. 31, 2003, now Pat. No. 7,009,213.

(51) Int. Cl.
*H01L 33/00* (2006.01)

(52) U.S. Cl. .................... 257/98; 257/99; 257/E33.073

(58) Field of Classification Search .......... 257/98–100, 257/E33.058, E33.037, E33.073, E33.071
See application file for complete search history.

(56) References Cited

U.S. PATENT DOCUMENTS 3,769,536 A    10/1973   Antypas et al.

(Continued)

FOREIGN PATENT DOCUMENTS

EP        393416 A1 *  10/1990

(Continued)

OTHER PUBLICATIONS

Chui et al., "High-Efficiency AlGaInP Light-Emitting Diodes", Semiconductor And Semimetals, vol. 64, Chapter 2, pp. 49-128.

(Continued)

*Primary Examiner*—Minh-Loan Tran
(74) *Attorney, Agent, or Firm*—Patent Law Group LLP

(57) ABSTRACT

A device includes a light emitting semiconductor device bonded to an optical element. In some embodiments, the optical element may be elongated or shaped to direct a portion of light emitted by the active region in a direction substantially perpendicular to a central axis of the semiconductor light emitting device and the optical element. In some embodiments, the semiconductor light emitting device and optical element are positioned in a reflector or adjacent to a light guide. The optical element may be bonded to the first semiconductor light emitting device by a bond at an interface disposed between the optical element and the semiconductor light emitting device. In some embodiments, the bond is substantially free of organic-based adhesives.

17 Claims, 11 Drawing Sheets

U.S. PATENT DOCUMENTS

| | | | |
|---|---|---|---|
| 4,391,683 A | 7/1983 | Buckley et al. | |
| 4,675,058 A | 6/1987 | Plaster | |
| 4,689,652 A | 8/1987 | Shimada et al. | |
| 4,815,084 A | 3/1989 | Scifres et al. | |
| 4,983,009 A | 1/1991 | Musk | |
| 4,988,579 A | 1/1991 | Tomomura et al. | |
| 5,040,868 A | 8/1991 | Waitl et al. | |
| 5,055,892 A | 10/1991 | Gardner et al. | |
| 5,130,531 A | 7/1992 | Ito et al. | |
| 5,132,430 A | 7/1992 | Gaudiana et al. | |
| 5,255,171 A | 10/1993 | Clark | |
| 5,317,170 A | 5/1994 | Paoli | |
| 5,336,644 A * | 8/1994 | Akhtar et al. | 501/15 |
| 5,376,580 A | 12/1994 | Kish et al. | |
| 5,418,384 A | 5/1995 | Yamana et al. | |
| 5,502,316 A | 3/1996 | Kish et al. | |
| 5,528,057 A | 6/1996 | Yanagase et al. | |
| 5,553,089 A | 9/1996 | Seki et al. | |
| 5,606,181 A | 2/1997 | Sakuma et al. | |
| 5,661,316 A | 8/1997 | Kish et al. | |
| 5,663,109 A * | 9/1997 | Dietz et al. | 501/41 |
| 5,698,452 A | 12/1997 | Goossen | |
| 5,724,376 A | 3/1998 | Kish, Jr. et al. | |
| 5,779,924 A | 7/1998 | Krames et al. | |
| 5,793,062 A | 8/1998 | Kish, Jr. et al. | |
| 5,837,561 A | 11/1998 | Kish, Jr. et al. | |
| 5,875,205 A | 2/1999 | Spaeth et al. | |
| 5,898,185 A | 4/1999 | Bojarczuk, Jr. et al. | |
| 5,917,201 A | 6/1999 | Ming-Jiunn et al. | |
| 5,925,898 A | 7/1999 | Späth | |
| 5,966,399 A | 10/1999 | Jiang et al. | |
| 6,015,719 A | 1/2000 | Kish, Jr. et al. | |
| 6,075,627 A | 6/2000 | Feldman et al. | |
| 6,091,020 A | 7/2000 | Fairbanks et al. | |
| 6,091,694 A | 7/2000 | Späth | |
| 6,155,699 A | 12/2000 | Miller et al. | |
| 6,165,911 A | 12/2000 | Calveley | |
| 6,214,733 B1 | 4/2001 | Sickmiller | |
| 6,233,267 B1 | 5/2001 | Nurmikko et al. | |
| 6,258,699 B1 | 7/2001 | Chang et al. | |
| 6,412,971 B1 | 7/2002 | Wojnarowski et al. | |
| 6,429,462 B1 | 8/2002 | Shveykin | |
| 6,469,785 B1 | 10/2002 | Duveneck et al. | |
| 6,483,196 B1 | 11/2002 | Wojnarowski et al. | |
| 6,495,862 B1 | 12/2002 | Okazaki et al. | |
| 6,598,998 B2 | 7/2003 | West et al. | |
| 6,784,463 B2 * | 8/2004 | Camras et al. | 257/99 |
| 7,053,419 B1 * | 5/2006 | Camras et al. | 257/98 |
| 2002/0030194 A1 * | 3/2002 | Camras et al. | 257/98 |
| 2002/0141006 A1 | 10/2002 | Pocius et al. | |
| 2003/0227249 A1 | 12/2003 | Mueller et al. | |
| 2003/0230757 A1 | 12/2003 | Suehiro et al. | |
| 2004/0051106 A1 | 3/2004 | Baur et al. | |

FOREIGN PATENT DOCUMENTS

| | | |
|---|---|---|
| EP | 0926744 A2 | 6/1999 |
| JP | 09153645 | 6/1997 |
| JP | 09167515 A | 6/1997 |
| WO | WO 00/69000 | 11/2000 |
| WO | WO 00/70687 | 11/2000 |
| WO | WO 01/41219 | 6/2001 |
| WO | WO 01/41225 | 6/2001 |
| WO | WO 01/80322 | 10/2001 |
| WO | WO 02/37578 | 5/2002 |

OTHER PUBLICATIONS

Babic et al., "Room-Temperature Continuous-Wave Operation of 1.54-µm Vertical-Cavity Lasers", IEEE Photonics Technology Letters, vol. 7, No. 11, Nov. 1995, pp. 1225-1227.

Chua et al., "Dielectrically-Bonded Long Wavelength Vertical Cavity Laser on GaAs Substrates Using Strain-Compensated Multiple Quantum Wells", IEEE Photonics Technology Letters, vol. 6, No. 12, Dec. 1994, pp. 1400-1402.

Fischer et al., "Highly Refractive Glasses to Improve Electroluminescent Diode Efficiencies", Journal of the Electrochemical Society: Solid State Science, Dec. 1969, pp. 1718-1722.

Carr, "Photometric Figures of Merit for Semiconductor Luminescent Sources Operating in Spontaneous Mode", Infrared Physics, 1966, vol. 6, pp. 1-19.

Mary T. Strzelecki et al., "Low Temperature Bonding of Glasses and Glass Ceramics", 8 pages.

Robert D. Simpson et al., "Hybrid Glass Structures For Telecommunication Applications", 8 pages.

Joseph S. Hayden, Passive and Active Characterization of Hybrid Glass Substrates for Telecommunication Applications, 8 pages.

J.W. Osenbach, et al., Low Cost/High Volume Laser Modules Using Silicon Optical Bench Technology, 1998 Electronic Components and Technology Conference, p. 581.

Aluminum Oxide, Al2O3 For Optical Coating, CERAC, Inc. Technical Publications, pp. 1-4.

"Bulk Measurement", Sairon Technology, Inc., pp. 1-3.

Thomas R. Anthony, "Dielectric isolation of silicon by anodic bonding", J. Appl. Phys. vol. 58, No. 3, Aug. 1, 1985, pp. 1240-1247.

Joshua Israelsohn, "Switching the light fantastic", Techtrends, EDN, Oct. 26, 2000, 10 pages.

Boris A. Matveev et al., "III-V Optically Pumped Mid-IR LEDs," Light-Emitting Diodes: Research Manufacturing, and Applications, V.H. Walter Yao, E. Fred Schubert Editors, Proceedings of SPIE vol. 4278 (2001), pp. 189-196.

* cited by examiner

LIGHT EMITTING DEVICES WITH IMPROVED LIGHT EXTRACTION EFFICIENCY

CROSS REFERENCE TO RELATED APPLICATIONS

This application is a Division of U.S. patent application Ser. No. 10/633,054, filed on Jul. 31, 2003 now U.S. Pat. No. 7,009,213, and incorporated herein by reference.

BACKGROUND OF THE INVENTION

Description of the Related Art

The light extraction efficiency of a light emitter is defined as the ratio of the LED's external quantum efficiency to the LED's internal quantum efficiency. Typically, the light extraction efficiency of a packaged LED is substantially less than one, i.e. much of the light generated in the LED's active region never reaches the external environment.

Light extraction efficiency is reduced by total internal reflection at interfaces between the LED and surrounding material followed by reabsorption of the totally internally reflected light in the LED. For example, for a cubic geometry LED on a transparent substrate encapsulated in epoxy, the refractive index (n) at the emission wavelength changes from a value of, for example, $n_{semi} \sim 3.5$ in the LED semiconductor to $n_{epoxy} \sim 1.5$ in the epoxy. The corresponding critical angle for total internal reflection of light incident on the epoxy encapsulant from the LED semiconductor of this example is $\theta_C = \arcsin(n_{epoxy}/n_{semi}) \sim 25°$. Neglecting scattering and multiple reflections, light emitted over $4\pi$ steradians from a point in the active region of the cubic LED crosses a semiconductor/epoxy encapsulant interface only if it is emitted into one of six narrow light cones, one for each interface, with each light cone having a half angle equal to the critical angle. Additional losses due to total internal reflection can occur at the epoxy/air interface. Consequently, an efficient conventional geometry (for example, rectangular parallelepiped) transparent substrate AlInGaP LED encapsulated in epoxy, for example, may have an external quantum efficiency of only ~40%, despite having an internal quantum efficiency of nearly 100%.

The effect of total internal reflection on the light extraction efficiency of LEDs is further discussed in U.S. Pat. Nos. 5,779,924; 5,793,062; and 6,015,719, all of them incorporated in their entirety herein by reference.

In one approach to improving light extraction efficiency, LEDs are ground into hemispherical shapes. Light emitted from a point in the active region of a hemispherically shaped LED intersects the hemispherical interface at near normal incidence. Thus, total internal reflection is reduced. However, this technique is tedious and wasteful of material. In addition, defects introduced during the grinding process may compromise the reliability and performance of the LEDs.

In another approach, LEDs are encapsulated (encased) in a material with a dome or hemispherically shaped surface. For example, the epoxy encapsulant of the above example may be dome shaped to reduce losses due to total internal reflection at the epoxy encapsulant/air interface. However, shaping the surface of a low refractive index encapsulant such as epoxy does not reduce losses due to total internal reflection at the semiconductor/low index encapsulant interface.

Moreover, epoxy encapsulants typically have coefficients of thermal expansion that poorly match those of the semiconductor materials in the LED. Consequently, the epoxy encapsulant subjects the LED to mechanical stress upon heating or cooling and may damage the LED. LEDs are also encapsulated in dome shaped high index glasses, which increase the critical angle for the semiconductor/encapsulant interface. Unfortunately, optical absorption in high index glasses and mechanical stress typically degrade the performance of an LED encapsulated in such glass.

SUMMARY

According to embodiments of the invention, a device includes a light emitting semiconductor device bonded to an optical element. In some embodiments, the optical element may be elongated or shaped to direct a portion of light emitted by the active region in a direction substantially perpendicular to a central axis of the semiconductor light emitting device and the optical element. In some embodiments, the semiconductor light emitting device and optical element are positioned in a reflector or adjacent to a light guide. The optical element may be bonded to the first semiconductor light emitting device by a bond at an interface disposed between the optical element and the semiconductor light emitting device. In some embodiments, the bond is substantially free of organic-based adhesives.

BRIEF DESCRIPTION OF THE DRAWINGS

FIGS. 15A-C are schematic diagrams of asymmetric optical elements bonded to light emitters in accordance with embodiments of the present invention.

DETAILED DESCRIPTION

FIGS. 1-18 illustrate a light emitting device 1, including a substantially transparent optical element 2 bonded to a light emitter 4 according to various embodiments of the invention. The figures describe various light emitters, various optical elements, and various ways to bond the light emitter to the optical element. The particular combinations of light emitter, optical element, and bond illustrated are not meant to be limiting. In general, any of the light emitters, optical elements, and bonds described may be combined. Bonding an optical element to a light emitter may increase the amount of light extracted from the top of the device and the ratio of top light to side light, allowing any optics used with the device to be tailored to top light, possibly resulting in a more efficient and compact system.

Figure 1A:
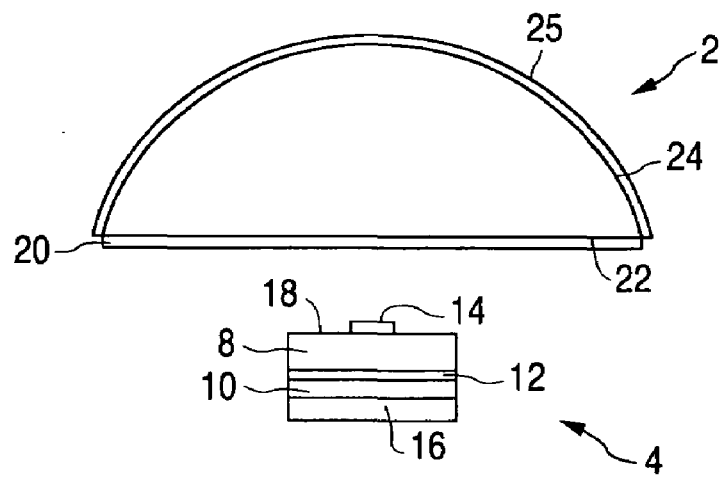
FIG. 1A is a schematic diagram of an optical element and a light emitter to be bonded to each other in accordance with an embodiment of the present invention.

FIG. 1A illustrates optical element 2 and light emitter 4 to be attached by a bond at an interface between light emitter 4 and optical element 2 in accordance with an embodiment of the present invention. Throughout the application the term "light emitter" includes, but is not limited to, light emitting diodes and laser diodes. In addition, various embodiments of the invention can be used as light detectors and solar cells as well.

Figure 1B:
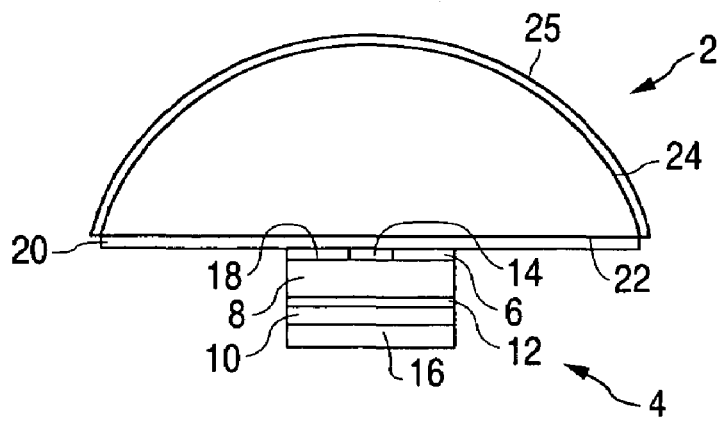
FIG. 1B is a schematic diagram of an optical element bonded with a bonding layer to a light emitter in accordance with an embodiment of the present invention.

FIG. 1B illustrates optical element 2 attached to light emitter 4 by a bond, which includes a substantially transparent bonding layer 6, in accordance with an embodiment of the present invention.

The term "transparent" is used herein to indicate that an optical element so described, such as a "transparent optical element," a "transparent bonding layer," a "transparent substrate," or a "transparent superstrate" transmits light at the emission wavelengths of light emitting device with a less than about 50% single pass loss, preferably less than about 10% single pass loss due to absorption or scattering. The emission wavelengths of light emitting device 4 may lie in the infrared, visible, or ultraviolet regions of the electromagnetic spectrum. One of ordinary skill in the art will recognize that the conditions "less than 50% single pass loss" and "less than 10% single pass loss" may be met by various combinations of transmission path length and absorption constant. As used herein, "optical concentrator" includes but is not limited to total internal reflectors, and includes optical elements having a wall coated with a reflective metal, a dielectric material, a reflective coating, or a total internal reflector to reflect or redirect incident light. Here an example of a reflective coating is the "white reflectance coating," produced by the Munsell Color company, which includes barium sulfate.

FIGS. 1A and 1B illustrate embodiments where light emitter 4 includes a stack of layers. The stack includes semiconductor layers and an active region, capable of emitting light. In detail, light emitter 4 includes a first semiconductor layer 8 of n-type conductivity (n-layer) and a second semiconductor layer 10 of p-type conductivity (p-layer). Semiconductor layers 8 and 10 are electrically coupled to active region 12. Active region 12 is, for example, a p-n diode junction associated with the interface of layers 8 and 10. Alternatively, active region 12 includes one or more semiconductor layers that are doped n-type or p-type or are undoped. Active region 12 can also include quantum wells. N-contact 14 and p-contact 16 are electrically coupled to semiconductor layers 8 and 10, respectively. Active region 12 emits light upon application of a suitable voltage across contacts 14 and 16. In alternative implementations, the conductivity types of layers 8 and 9, together with contacts 14 and 16, are reversed. That is, layer 8 is a p-type layer, contact 14 is a p-contact, layer 10 is an n-type layer, and contact 16 is an n-contact.

Semiconductor layers 8 and 10 and active region 12 are formed from III-V semiconductors including but not limited to AlN, AlP, AlAs, AlSb, GaN, GaP, GaAs, GaSb, InN, InP, InAs, InSb, II-VI semiconductors including but not limited to ZnS, ZnSe, CdSe, CdTe, group IV semiconductors including but not limited to Ge, Si, SiC, and mixtures or alloys thereof. These semiconductors have indices of refraction ranging from about 2.4 to about 4.1 at the typical emission wavelengths of light emitting devices in which they are present. For example, III-Nitride semiconductors such as GaN have refractive indices of about 2.4 at 500 nm, and III-Phosphide semiconductors such as InGaP have refractive indices of about 3.6-3.7 at 600 nm.

Contacts 14 and 16 are, in one implementation, metal contacts formed from metals including but not limited to gold, silver, nickel, aluminum, titanium, chromium, platinum, palladium, rhodium, rhenium, ruthenium, tungsten, and mixtures or alloys thereof. In another implementation, one or both of contacts 14 and 16 are formed from transparent conductors such as indium tin oxide.

Although the figures illustrate specific light emitting device structures, the present invention is independent of the structure and number of semiconductor layers in light emitter 4 and of the detailed structure of active region 12. Also, light emitter 4 may include, for example, transparent substrates and superstrates not illustrated in FIGS. 1A and 1B.

Further, dimensions of the various elements of light emitter 4 illustrated in the various figures are not to scale.

In some embodiments transparent optical element 2 includes a metallization layer 20. Metallization layer 20 is electrically coupled to contact 14 of light emitter 4. Metallization layer 20 is formed from metals including but not limited to gold, silver, nickel, aluminum, titanium, chromium, platinum, palladium, rhodium, rhenium, ruthenium, tungsten, and mixtures or alloys thereof. In another implementation, metallization layer 20 is formed from transparent conductors such as indium tin oxide. In one embodiment metallization layer 20 is a mesh, in other embodiments a continuous or patterned layer. The thickness of metallization layer 20 is in the range of, for example, about 2 Å to about 5000 Å. Metallization layer 20 transmits greater than about 10%, preferably greater than about 50%, of the incident light. Metallization layer 20 is formed on surface 22 of transparent optical element 2. In some embodiments surface 22 is substantially flat.

Transparent optical element 2 is bounded by surface 24. The shape of surface 24 reduces the reflection of the light, emitted by light emitter 4, as discussed in detail below. In addition, losses at surface 24 can be further reduced by applying a conventional antireflection coating 25 to surface 24.

FIG. 1B illustrates an embodiment where a layer of bonding material is applied on a top surface 18 of light emitter 4 to form transparent bonding layer 6. Transparent bonding layer 6 bonds optical element 2 and light emitter 4. Transparent bonding layer 6 is, for example, about 10 Angstroms (Å) to about 100 microns (µm) thick. The bonding material is applied, for example, by conventional deposition techniques including but not limited to spinning, sputtering, evaporation, chemical vapor deposition (CVD), or as part of material growth by, for example, metal-organic chemical vapor deposition (MOCVD), vapor phase epitaxy (VPE), liquid phase epitaxy (LPE), or molecular beam epitaxy (MBE). Transparent bonding layer 6 is optionally patterned with, for example, conventional photolithographic and etching techniques to leave contact 14 uncovered by bonding material and thus to permit contact 14 to make electrical contact with optional metallization layer 20 on optical element 2.

In an alternative embodiment, transparent bonding layer 6 is formed on substantially flat surface 22 of optical element 2 or on the surface of metallization layer 20 and optionally patterned with, for example, conventional photolithographic and etching techniques to permit electrical contact between contact 14 and metallization layer 20. In another embodiment transparent bonding layers such as bonding layer 6 are formed on both surface 18 of light emitter 4 and surface 22 of optical element 2. In other embodiments, contact 14 is not separately provided, and bonding layer 6 is patterned to permit electrical contact between metallization layer 20 and n-layer 8.

Figure 1C:
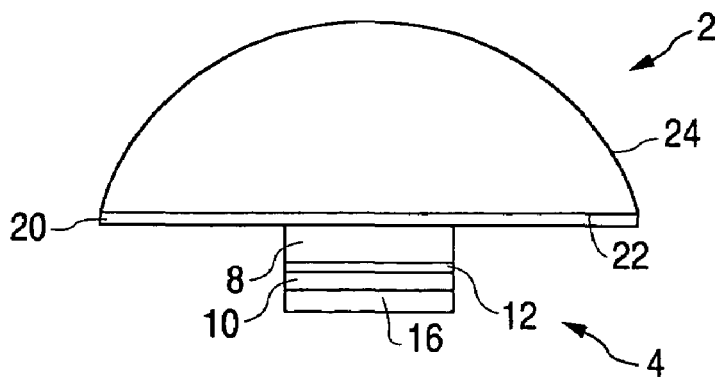
FIG. 1C is a schematic diagram of an optical element bonded to a light emitter in accordance with another embodiment of the present invention.
Figure 1D:
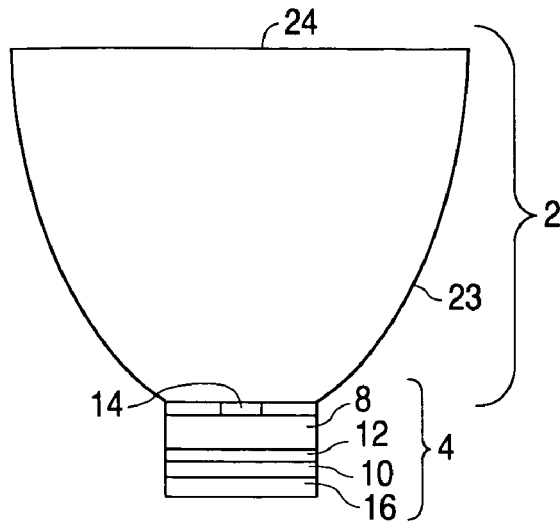
FIG. 1D is a schematic diagram of an optical concentrator bonded to a light emitter in accordance with another embodiment of the present invention.

FIG. 1C illustrates an embodiment without contact 14 and bonding layer 6. Here metallization layer 20 additionally functions as a contact layer for light emitter 4 and as a bonding layer. In other embodiments, contact 14 is not located on surface 18 and the metallization layer 20 is not used.

In the subsequent embodiments bonding layer 6 is formed on light emitter 4. However, in alternative embodiments bonding layer 6 can be formed on surface 22 of optical element 2, or on both light emitter 4 and surface 22.

In some implementations, the bonding material of transparent bonding layer 6 is a high index optical glass, i.e. an optical glass having a refractive index greater than about 1.5 in the range of wavelengths emitted by active region 12. Preferably, the refractive index of bonding layer 6 is greater than about 1.8.

In some implementations the bonding material of bonding layer 6 has a suitably low softening temperature. A definition of the softening temperature is the temperature, where the glass starts to appreciably deform under its own weight. The softening temperature can be higher than the glass transition temperature. The softening temperature of the bonding material can be in the range of about 250° C. to about 500° C., for example, within the range of 300° C. to 400° C. Bonding layer 6 is formed by heating the bonding material to a temperature in the proximity of the softening temperature $T_s$, as described below.

In some implementations, the transparency of bonding layer 6 is high. Transparency is controlled, among others, by the bandgap of the bonding material of bonding layer 6. Bonding materials with larger bangdap often have better transparency.

Transparent bonding layer 6 is formed, for example, from Schott glass SF59, a dense flint glass which has refractive index (n)~1.95 at ~600 nanometers (nm) and a glass transition temperature ~362° C. Alternatively, transparent bonding layer 6 is formed from high index optical glasses including but not limited to Schott glass LaSF 3, with n~1.81 at ~600 nm and glass transition temperature ~630° C.; Schott glass LaSF N18, with n~1.91 at ~600 nm and glass transition temperature ~660° C.; and mixtures thereof. These glasses are available from Schott Glass Technologies Incorporated, of Duryea, Pa. Bonding layer 6 may also be formed from a high index chalcogenide glass, such as (Ge,As,Sb,Ga)(S,Se,Te) chalcogenide glasses, for example or from a high index chalcohalide glass, such as (Ge,As,Sb,Ga)(S,Se,Te,F,Cl,Br,I) chalcohalide glasses, for example.

In other implementations, bonding layer 6 is formed from III-V semiconductors including but not limited to GaP (n~3.3 at 600 nm), InGaP (n~3.7 at 600 nm), GaAs (n~3.4 at 500 nm), and GaN (n~2.4 at 500 nm); II-VI semiconductors including but not limited to ZnS (n~2.4 at 500 nm), ZnSe (n~2.6 at 500 nm), ZnTe (n~3.1 at 500 nm), CdS (n~2.6 at 500 nm), CdSe (n~2.6 at 500 nm), and CdTe (n~2.7 at 500 nm); group IV semiconductors and compounds including but not limited to Si (n~3.5 at 500 nm), SiC, and Ge (n~4.1 at 500 nm); organic semiconductors, metal and rare earth oxides including but not limited to tungsten oxide, tellurium oxide, lead oxide, titanium oxide (n~2.9 at 500 nm), nickel oxide (n~2.2 at 500 nm), zirconium oxide (n~2.2 at 500 nm), indium tin oxide, chromium oxide, antimony oxide (n~2.1), bismuth oxide (n~1.9-2.5), gallium oxide (n~1.94), germanium oxide (n~2.0), molybdenum oxide (n~2.4), cadmium oxide (n~2.47), cobalt oxide (n~2.4), cerium oxide (n~2.3), indium oxide (n~2.0), neodymium oxide (n~2.0); oxyhalides such as bismuth oxychloride (n~2.15); metal fluorides including but not limited to magnesium fluoride (n~1.4 at 500 nm) and calcium fluoride (n~1.4 at 500 nm); metals including but not limited to Zn, In, Mg, and Sn; yttrium aluminum garnet (YAG), phosphide compounds, arsenide compounds, antimonide compounds, nitride compounds, high index organic compounds; and mixtures or alloys thereof.

Bonding layer 6 includes, in some implementations, luminescent material that converts light of wavelengths emitted by active region 12 to other wavelengths. The luminescent material includes, for example, conventional phosphor particles, organic semiconductors, II-VI or III-V semiconductors, II-VI or III-V semiconductor quantum dots or nanocrystals, dyes, polymers, and materials such as GaN that luminesce from defect centers. If bonding layer 6 includes conventional phosphor particles, then bonding layer 6 should be thick enough to accommodate particles typically having a size of about 5 microns to about 50 microns.

In one implementation, bonding layer 6 is formed from a material with a high refractive index n at the light emitting device's emission wavelengths. In some embodiments the refractive index is greater than about 1.5, preferably greater than about 1.8. In some embodiments the refractive index is less than that of the top layer of light emitter 4, for example, semiconductor layer 8. Hence, a critical angle exists for total internal reflection of light incident on the semiconductor layer 8/bonding layer 6 interface from inside light emitter 4. This critical angle is increased compared to the critical angle for an interface between light emitter 4 and epoxy or air, however, and more light is extracted through surface 18 into bonding layer 6 than would be extracted into an epoxy encapsulant or air. In another implementation, the refractive index of bonding layer 6 (for example, ZnS or ZnSe) is greater than or equal to that of semiconductor layer 8 (for example, GaN), and none of the light incident on bonding layer 6 from inside light emitter 4 is totally internally reflected. Neglecting Fresnel reflection losses, which can be minimized by approximately matching the refractive indices of bonding layer 6 and the top layer of light emitter 4, in the latter case also more light is extracted through surface 18 into bonding layer 6 than would be extracted into an epoxy encapsulant or air.

In some embodiments, the bond between light emitter 4 and optical element 2 is substantially free of traditional organic-based adhesives such as epoxies, since such adhesives tend to have a low index of refraction.

In another implementation, transparent bonding layer 6 is formed from a low refractive index bonding material, i.e., a bonding material having a refractive index less than about 1.5 at the light emitting device's emission wavelengths. Magnesium fluoride, for example, is one such bonding material. Low index optical glasses, epoxies, and silicones may also be suitable low index bonding materials. One of ordinary skill in the art will recognize that efficient transmission of light from light emitter 4 across transparent bonding layer 6, formed from a low index material, to optical element 2 can be achieved if bonding layer 6 is sufficiently thin. Accordingly, in this implementation losses due to total internal reflection at the light emitter 4/bonding layer 6 interface are reduced by making the thickness of bonding layer 6 less than about 500 Å, preferably less than about 100 Å. Optical element 2 might bond poorly to light emitter 4 if the roughness of surface 18 or surface 22 or typical height of irregularities on surface 18 or surface 22 exceed the thickness of bonding layer 6. In this embodiment, surfaces 18 and 22 are optionally polished to achieve a surface roughness of magnitude less than or equal to the thickness of bonding layer 6.

If light emitter 4 includes material that absorbs light emitted by active region 12, and if bonding layer 6 is formed from a low index material but is not thin as described above, then a large portion of the light emitted by active region 12 will typically be trapped in light emitter 4 and lost to absorption even if bonding layer 6 is itself nonabsorbing. In contrast, a bonding layer 6 formed from a high index material will typically couple a larger fraction of light emitted by active region 12 out of light emitter 4 into optical element 2, even if the high index bonding material is a material such as a chalcogenide glass, for example, which absorbs a portion of the emitted light.

After transparent bonding layer 6 is applied to light emitter 4, the surface 22 of optical element 2 is positioned against bonding layer 6. The temperature of bonding layer 6 is then raised to a temperature between about room temperature and about 1000° C., and optical element 2 and light emitter 4 are pressed together for a period of time of about one second to about 6 hours at a pressure of about 1 pound per square inch (psi) to about 6000 psi. The inventors believe that this process bonds optical element 2 to light emitter 4 by a bond effected at the interface between optical element 2 and bonding layer 6 (formed on light emitter 4) by, for example, material transfer via shear stress, evaporation-condensation, liquification, melting, or softening, followed by solidification, diffusion, or alloying. The inventors believe that in some implementations optical element 2 is bonded to light emitter 4 by a bond similarly effected by, for example, material transfer between bonding layers formed on each of optical element 2 and light emitter 4, or between bonding layer 6 (formed on optical element 2) and light emitter 4. Thus, a bonded interface characterized by material transfer may be disposed between optical element 2 and light emitter 4. In some implementations, for example, surface 18 at the interface of n-layer 8 and bonding layer 6 is such a bonded interface. In another implementation, an interface of bonding layers formed on each of optical element 2 and light emitter 4 is a bonded interface. In another implementation, an interface of optical element 2 and bonding layer 6 is a bonded interface.

If transparent bonding layer 6 is formed on light emitter 4 from an optical glass, for example, then in one implementation the temperature of bonding layer 6 is raised to about the strain point temperature of the optical glass. The strain point temperature is the temperature at which the optical glass has a viscosity of about $10^{14.5}$ poises. The strain point temperature corresponds to the first nonlinearity in a plot of expansion versus temperature for the optical glass, and thus represents the lower limit of the annealing range. The strain point is near to but less than the glass transition temperature. The viscosity at the glass transition temperature is about $10^{13}$ poises. Finally, the softening temperature is the temperature, where the material deforms appreciably under its own weight. The viscosity at the softening temperature is about $10^{7.65}$ poises. Heating the optical glass to near or above the softening temperature increases its flexibility and lowers its surface tension, allowing the optical glass to microscopically conform to surface 22 and to effect a bond between optical element 2 and bonding layer 6.

The process of bonding optical element 2 to light emitter 4 described above may be performed with devices disclosed in U.S. Pat. Nos. 5,502,316 and 5,376,580, incorporated herein by reference. The disclosed devices bond semiconductor wafers to each other at elevated temperatures and pressures. These devices may be modified to accommodate light emitters and optical elements, as necessary. Alternatively, the bonding process described above may be performed with a conventional vertical press.

Transparent optical element 2 can be formed, for example, from SiC (n~2.7 at 500 nm), aluminum oxide (sapphire, n~1.8 at 500 nm), diamond (n~2.4 at 500 nm), cubic zirconia ($ZrO_2$), aluminum oxynitride (AlON) by Sienna Technologies Inc., polycrystalline aluminum oxide (transparent alumina), spinel, Schott glass LaFN21, Schott glass LaSFN35, LaF2, LaF3, and LaF10 available from Optimax Systems Inc. of Ontario, N.Y., or any of the materials listed above for use as bonding materials in transparent bonding layer 6, excluding thick layers of the metals. A mismatch between the thermal expansion coefficients of optical element 2 and light emitter 4 to which optical element 2 is bonded can cause optical element 2 to detach from light emitter 4 upon heating or cooling. Also, approximately matching thermal expansion coefficients reduces the stress induced in light emitter 4 by bonding layer 6 and optical element 2. Hence, in one implementation optical element 2 is formed from a material having a thermal expansion coefficient approximately matching the thermal expansion coefficient of light emitter 4 to which optical element 2 is bonded. Spinel is desirable as an optical element material because the coefficient of thermal expansion of spinel is the same for every crystallographic orientation.

In one embodiment, transparent optical element 2 has a shape and a size such that light entering optical element 2 from light emitter 4 will intersect surface 24 of optical element 2 at angles of incidence near normal incidence. Total internal reflection at the interface of surface 24 and the ambient medium, typically air, is thereby reduced. In addition, since the range of angles of incidence is narrow, Fresnel reflection losses at surface 24 can be reduced by applying a conventional antireflection coating 25 to surface 24. The shape of optical element 2 is, for example, a portion of a sphere such as a hemisphere, a Weierstrass sphere (truncated sphere), or a portion of a sphere less than a hemisphere. Alternatively, the shape of optical element 2 is a portion of an ellipsoid such as a truncated ellipsoid. The angles of incidence at surface 24 for light entering optical element 2 from light emitter 4 more closely approach normal incidence as the size of optical element 2 is increased. Hence, the smallest ratio of a length of the base of transparent optical element 2 to a length of the surface 18 of light emitter 4 is preferably greater than about 1, more preferably greater than about 2. For example, in various embodiments a light emitter 1 mm long may be bonded to a hemispherical optical element 2.5 mm in diameter and 1.25 mm tall at the center; a light emitter 2 mm long may be bonded to a hemispherical optical element 5 mm in diameter and 2.5 mm tall at the center; and a light emitter 3 mm long may be bonded to a hemispherical optical element 7.5 mm in diameter and 3.75 mm tall at the center. Typically, the optical element is much thicker than the light emitter. For example, a III-nitride light emitter of the sizes described above may be 100 microns thick, and a III-phosphide light emitter of the sizes described above may be 250 microns thick.

One of ordinary skill in the art will recognize that the maximum size for which an optical element 2 of a particular material continues to be transparent as defined above is determined by the absorption constant of the optical element material at the emission wavelengths of the light emitting device. In one implementation, optical element 2 is a Fresnel lens, formed on a flat surface or a curved surface. Fresnel lenses are typically thinner than, for example, spherical optical elements of comparable focal lengths, and hence are less absorptive. Fresnel lenses or grooved surfaces can also be formed on curved surfaces such as a dome or cylindrical surface of the light emitter or optical element. Light emitters utilizing Fresnel lenses have been described in U.S. patent application Ser. No. 09/823,841, entitled "Forming an optical element on the surface of a light emitting device for improved light extraction," by Douglas W. Pocius, Michael D. Camras, and Gloria E. Höfler, hereby incorporated in its entirety by reference.

Optical element 2 includes, in one implementation, luminescent material that converts light of wavelengths emitted by active region 12 to other wavelengths. In another implementation, a coating on surface 22, for example, includes luminescent material. The luminescent material includes, for example, conventional phosphor particles, organic semiconductors, II-VI or III-V semiconductors, II-VI or III-V semiconductor quantum dots or nanocrystals, dyes, polymers, and materials such as GaN that luminesce from defect centers. Alternatively, a region of optical element 2 near surface 22 is doped, for example, with a luminescent material.

The magnitudes of the refractive indices of optical element 2 ($n_{optical\ element}$), bonding layer 6 ($n_{bond}$), and the top layer of light emitter 4 ($n_{LED}$) can be ordered in six permutations. If $n_{LED} \leq n_{bond} \leq n_{optical}$ element or $n_{LED} \leq n_{optical\ element} \leq n_{bond}$, then losses due to total internal reflection are eliminated, but Fresnel losses may occur. In particular, if $n_{LED} = n_{bond} = n_{optical\ element}$, then light enters optical element 2 from light emitter 4 without losses due to Fresnel or total internal reflection. Alternatively, if $n_{bond} \leq n_{LED} \leq n_{optical\ element}$ but either $n_{bond} > n_{epoxy}$ or bonding layer 6 is thin as described above, then, neglecting Fresnel reflection losses, more light is extracted into optical element 2 than would be extracted into an epoxy encapsulant or air. Similarly, if $n_{bond} \leq n_{optical\ element} \leq n_{LED}$ but either $n_{bond} > n_{epoxy}$ or bonding layer 6 is thin as described above and $n_{optical\ element} > n_{epoxy}$, then, neglecting Fresnel reflection losses, more light is extracted into optical element 2 than would be extracted into an epoxy encapsulant or air. If $n_{optical\ element} \leq n_{bond} \leq n_{LED}$ or $n_{optical\ element} \leq n_{LED} \leq n_{bond}$ but $n_{optical\ element} > n_{epoxy}$, then, neglecting Fresnel reflection losses, more light is extracted into optical element 2 than would be extracted into an epoxy encapsulant or air. Thus, transparent optical element 2 preferably has a refractive index at the emission wavelengths of light emitter 4 greater than about 1.5, more preferably greater than about 1.8. A similar analysis applies if the ambient medium is air ($n_{air} \sim 1$) rather than an epoxy encapsulant, with $n_{air}$ substituted for epoxy.

If bonding layer 6 includes phosphor particles and the refractive index of the bonding material, preferably a high index chalcogenide glass, approximately matches the refractive index of the phosphor particles, then scattering by the phosphor particles of light emitted by the active region or by the phosphor particles will be negligible. Preferably, the refractive indices of the phosphor particles, the bonding material, the top layer (for example n-layer 8) of light emitter 4, and the optical element are all about equal. This is the case if the top layer of light emitter 4 is InGaN, the phosphor particles are SrS:Eu and/or SrGaS:Eu, and the optical element is ZnS.

Figure 2:
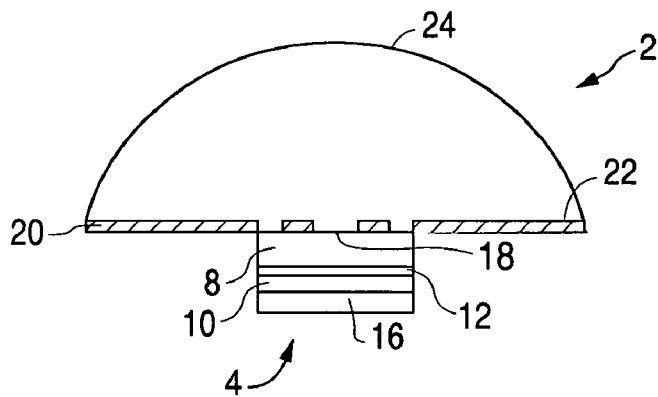
FIG. 2 is a schematic diagram of an optical element directly bonded to a light emitter in accordance with an embodiment of the present invention.

FIG. 2 illustrates an alternative embodiment, where transparent optical element 2 is bonded directly to a top surface 18 of light emitter 4 without the use of a separate bonding layer. The inventors believe that a bond is effected between optical element 2 and light emitter 4 by, for example, material transfer via shear stress, evaporation-condensation, dissolution-condensation, liquification (or melting or softening) followed by solidification, diffusion, or alloying. Metallization layer 20, if present, is patterned to allow surface 22 of optical element 2 to directly contact surface 18. Surface 22 is optionally also patterned by etching, for example. In one implementation of this embodiment, transparent optical element 2 is formed from a material, such as those listed above, which could be used to form a separate bonding layer. In another implementation, the material from which the top layer of light emitter 4 (for example, n-layer 8 in FIG. 2) is formed is suitable as a bonding material. Thus either optical element 2 or a top layer of light emitter 4 functions additionally as a bonding layer, and no separate bonding layer is necessary. In one implementation, the interface of optical element 2 and light emitter 4 at surface 18, for example, is a bonded interface characterized by mass transfer between optical element 2 and light emitter 4.

For optical element 2 directly bonded to light emitter 4, if $n_{LED} \leq n_{optical\ element}$ or if $n_{optical\ element} < n_{LED}$ but $n_{optical\ element} > n_{epoxy}$, then, neglecting Fresnel reflection losses, more light is extracted into optical element 2 than would be extracted into an epoxy encapsulant. A similar analysis applies if the ambient medium is air ($n_{air} \sim 1$) rather than an epoxy encapsulant, with $n_{air}$ substituted for $n_{epoxy}$.

Transparent optical element 2 is directly bonded to light emitter 4 at temperatures and pressures as described above for the bonding process utilizing bonding layer 6. In one implementation, surface 18 of light emitter 4 or surface 22 of optical element 2 is doped with a material exhibiting a high diffusivity such as, for example, Zn or Si. Such doping can be accomplished during materials growth by MOCVD, VPE, LPE or MBE, for example, or after materials growth by, for example, implantation. In another implementation, a thin layer of a high diffusivity material is disposed between optical element 2 and light emitter 4 by deposition on at least one of surfaces 18 and 22. Deposition can be accomplished, for example, by conventional means such as evaporation or sputtering. The inventors believe that during the bonding process the high diffusivity material diffuses across the interface between optical element 2 and light emitter 4 and enhances material transfer between optical element 2 and light emitter 4. The amount of high diffusivity material used should be sufficiently low to maintain the transparency of, for example, optical element 2 and the top layer of light emitter 4.

Application of the bonding method is not limited to a pre-made optical element. Rather, transparent optical element 2 may be a block of transparent optical element material that is bonded to light emitter 4 in the manner described above, and then formed into optical element 2. Optical element 2 may be formed using etching, perhaps in conjunction with photolithography or other lithographic techniques, electron beam lithography, ion beam lithography, X-ray lithography, or holographic lithography. Wet or dry chemical etching techniques such as plasma etching, reactive ion etching (RIE), and chemically-assisted ion beam etching (CAIBE) may be used as well. Also, optical element 2 may be milled into a surface of the transparent optical element material using ion beam milling or focused ion beam milling (FIB), ablated into the surface with a scanning electron or a laser beam, or mechanically machined into the surface by sawing, milling, or scribing. In addition, optical element 2 may be stamped into the block of transparent optical element material using the method disclosed in U.S. patent application Ser. No. 09/823,841.

It is advantageous to bond light emitter 4 to optical element 2 rather than to conventionally encase light emitter 4 in an encapsulant. For example, the light extraction efficiency through surface 18 of light emitter 4 bonded to optical element 2 with or without bonding layer 6, as described above, is improved compared to a conventional epoxy encapsulated light emitters. In addition, light emitter 4 need not be subject to the damaging stress experienced by epoxy encapsulated (encased) light emitters. Moreover, in the absence of epoxy encapsulants, which degrade at relatively low temperatures, light emitter 4 can be run at higher temperatures. Consequently, the light output of light emitter 4 can be increased by running the light emitter at higher current densities.

If desired, however, light emitter 4 bonded to optical element 2 could be additionally encapsulated in, for example, epoxy or silicone. Such encapsulation of light emitter 4 bonded to optical element 2 would not effect the light extraction efficiency through surface 18 of light emitter 4 into optical element 2. Total internal reflection at the interface of surface 24 and the encapsulant would be minimized, as described above, by the shape and size of optical element 2.

In some implementations, light emitter 4 includes, for example, metallization for electrical contacts that degrades at elevated temperatures. In other implementations, light emitter 4 is bonded to a submount, not shown, with solders or silver bearing die-attach epoxies that degrade at high temperatures. (Note that die-attach epoxy is to be distinguished from an epoxy encapsulant.) Consequently, in one implementation the process of bonding optical element 2 to light emitter 4, with or without a bonding layer 6, occurs at temperatures less than about 500° C. in order to avoid, for example, degrading the metallization or the die-attach epoxy. In another implementation, optical element 2 is bonded to an incomplete light emitting device, for example, a light emitting device missing some or all metallization. In the latter implementation, fabrication of the light emitting device is completed after the optical element bonding process.

Figure 3:
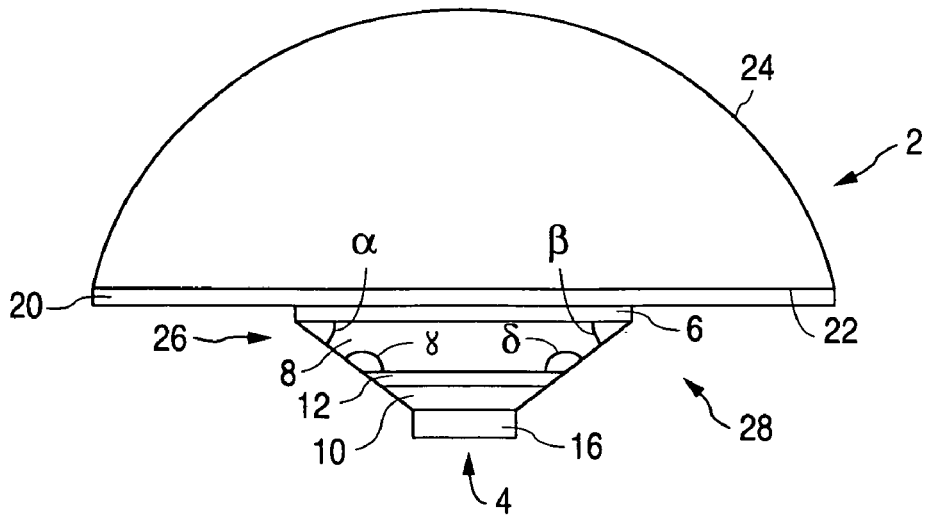
FIG. 3 is a schematic diagram of an optical element bonded with a bonding layer to a light emitter having beveled sides in accordance with an embodiment of the present invention.

FIG. 3 illustrates an embodiment, where sides 26 and 28 of light emitter 4 are beveled such that they intersect bonding layer 6 at angles α and β, respectively, less than 90° and intersect active region 12 at angles γ and δ, respectively, greater than 90°. Though two beveled sides are shown in FIG. 3, in other embodiments light emitter 4 has more or less than two beveled sides and is, for example, substantially conical or pyramidal in shape.

Beveled sides 26 and 28 reflect light emitted from active region 12 toward bonding layer 6. Light that might otherwise have been trapped in light emitter 4 or lost out the sides of the light emitter is thereby advantageously extracted through bonding layer 6 and optical element 2. In one embodiment, light emitter 4 is surrounded by a low refractive index medium such as air, and a portion of the light incident on beveled sides 26 and 28 from active region 12 is totally internally reflected toward bonding layer 6. In another embodiment, beveled sides 26 and 28 are coated with a reflective coating, in one implementation a metal layer and in another implementation a dielectric layer, that reflects light toward bonding layer 6.

In one embodiment, contact 16 is highly reflective. Accordingly, in this embodiment light incident on contact 16 is reflected toward bonding layer 6 and optical element 2 either directly or after additional reflection from side 26 or side 28. The light extraction efficiency of light emitter 4 is consequently increased.

Figure 4:
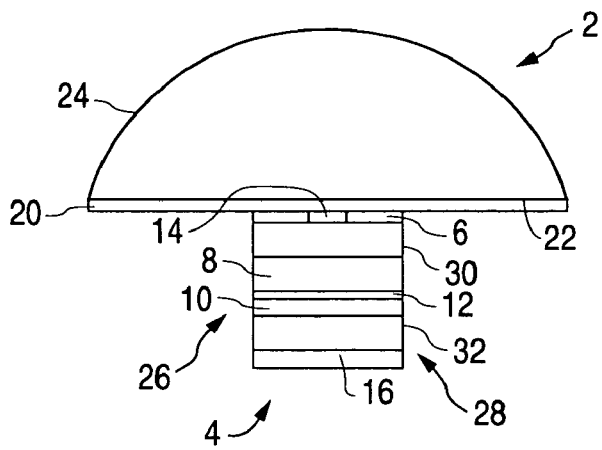
FIG. 4 is a schematic diagram of an optical element bonded with a bonding layer to a light emitter having substrate and superstrate layers in accordance with an embodiment of the present invention
Figure 5:
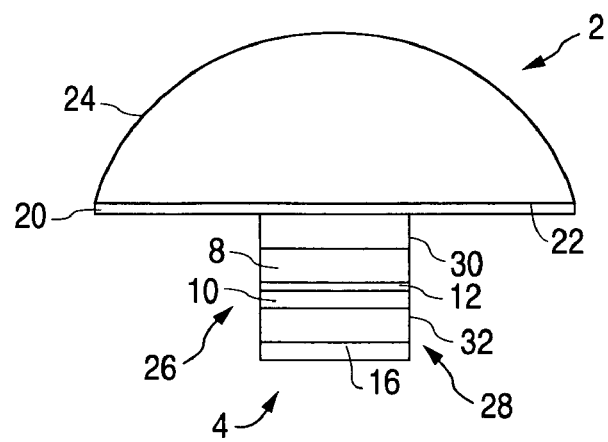
FIG. 5 is a schematic diagram of an optical element directly bonded to a light emitter having substrate and superstrate layers in accordance with an embodiment of the present invention

FIGS. 4 and 5 illustrate embodiments, where light emitter 4 includes conducting transparent superstrate 30 electrically coupled to metallization layer 20 and electrically coupled to n-layer 8, and conducting, optionally transparent, substrate 32 electrically coupled to p-layer 10 and to contact 16. Superstrate 30 and (optionally) substrate 32 are formed, for example, from semiconductors having a band gap energy greater than the energy of photons emitted by light emitter 4. Superstrate 30 and (optionally) substrate 32 can also be formed from sapphire, SiC (silicon carbide), aluminum oxynitride (AlON) of Sienna Technologies Inc., GaN, AlN, spinel, and polycrystalline aluminum oxide (transparent alumina).

Superstrate 30 is formed from a material having an index of refraction at the emission wavelengths of active region 12 preferably greater than about 1.5, more preferably greater than about 1.8. In other implementations, sides 26 and 28 of light emitter 4 are beveled and highly reflective and contact 16 is highly reflective, as described above. In the embodiment illustrated in FIG. 4, transparent optical element 2 is bonded to superstrate 30 with bonding layer 6, and n-layer 8 is electrically coupled to metallization layer 20 by n-contact 14.

FIG. 5 illustrates an embodiment where transparent optical element 2 is directly bonded to superstrate 30 and n-contact 14 is not separately provided.

Figure 6:
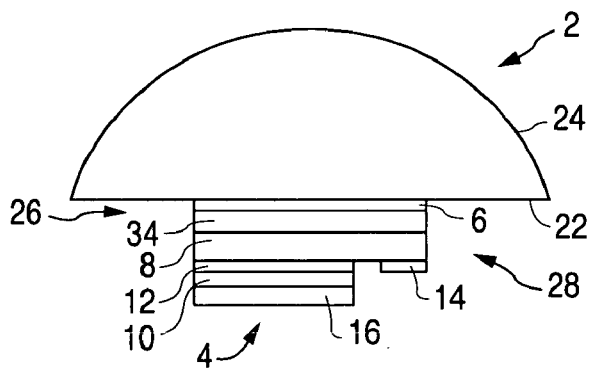
FIG. 6 is a schematic diagram of an optical element bonded with a bonding layer to a light emitter having a "flip chip" geometry in accordance with an embodiment of the present invention.
Figure 7:
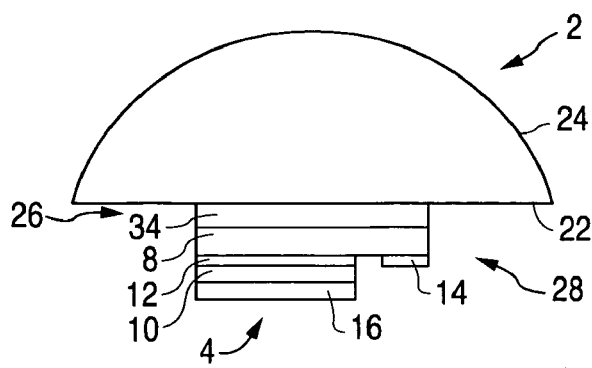
FIG. 7 is a schematic diagram of an optical element directly bonded to a light emitter having a "flip chip" geometry in accordance with an embodiment of the present invention

Contact 14 and contact 16 are disposed on the same side of light emitter 4 in the "flip chip" embodiments illustrated in FIGS. 6 and 7. Since optical element 2 is bonded to the opposite side of light emitter 4 from contacts 14 and 16, no metallization layer is required on optical element 2 in these embodiments. The light extraction efficiency into optical element 2 is improved by the absence of the metallization layer. In other implementations, sides 26 and 28 of light emitter 4 are beveled and highly reflective and contact 16 is highly reflective, as described above. Transparent superstrate 34 is formed from a material such as, for example, sapphire, SiC, GaN, AlN, or GaP, having an index of refraction at the emission wavelengths of active region 12 preferably greater than about 1.5, more preferably greater than about 1.8. Transparent superstrate 34 can also be formed from aluminum oxynitride (AlON) of Sienna Technologies Inc., spinel, an oxide of tellurium, an oxide of lead, an oxide of tungsten, and polycrystalline aluminum oxide (transparent alumina).

FIG. 6 illustrates an embodiment where optical element 2 is bonded with bonding layer 6 to transparent superstrate 34. FIG. 7 illustrates an embodiment where optical element 2 is directly bonded to transparent superstrate 34.

In one implementation of the embodiments illustrated in FIGS. 6 and 7, optical element 2 is formed from ZnS, superstrate 34 is formed from SiC or GaN, and n-layer 8 is formed from a III-Nitride semiconductor such as GaN. In another implementation, optical element 2 is formed from GaP, superstrate 34 is formed from GaP, and n-layer 8 is formed from a III-Phosphide semiconductor such as an AlInGaP alloy. If present, transparent bonding layer 6 is formed, for example, from ZnS.

Figure 8:
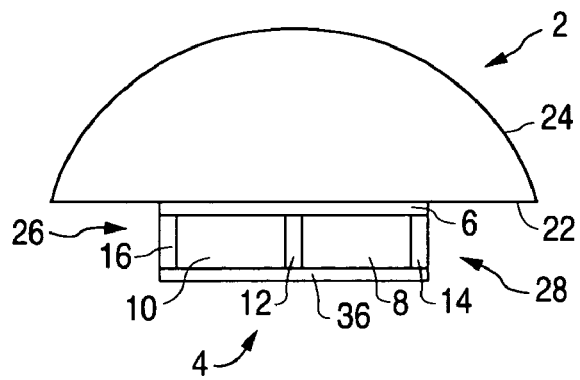
FIG. 8 is a schematic diagram of an optical element bonded with a bonding layer to a light emitter having an active region substantially perpendicular to the optical element.
Figure 9:
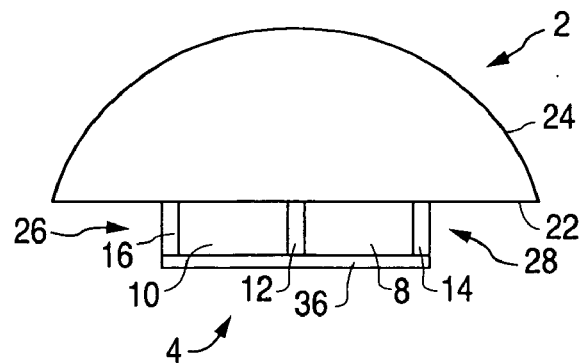
FIG. 9 is a schematic diagram of an optical element bonded directly to a light emitter having an active region substantially perpendicular to the optical element.

FIGS. 8 and 9 illustrate embodiments where the orientation of n-layer 8, p-layer 10, and active region 12 is substantially perpendicular to optical element 2. As in the embodiments illustrated in FIGS. 6 and 7, no metallization layer is required on optical element 2. In the embodiment illustrated in FIG. 8, optical element 2 is bonded with bonding layer 6 to light emitter 4. In the embodiment illustrated in FIG. 9, optical element 2 is directly bonded to light emitter 4. In one implementation, light emitter 4 is sawn ("diced") from a wafer with cuts made in a direction substantially perpendicular to layers 8 and 10 and to active region 12. In this implementation, the surface of light emitter 4 to be bonded to optical element 2 is optionally polished to reduce its roughness. In other implementations, sides 26 and 28 of light emitter 4 are beveled, contact 14 and contact 16 are highly reflective, and reflective layer 36 is located to reflect light into optical element 2.

Figure 10:
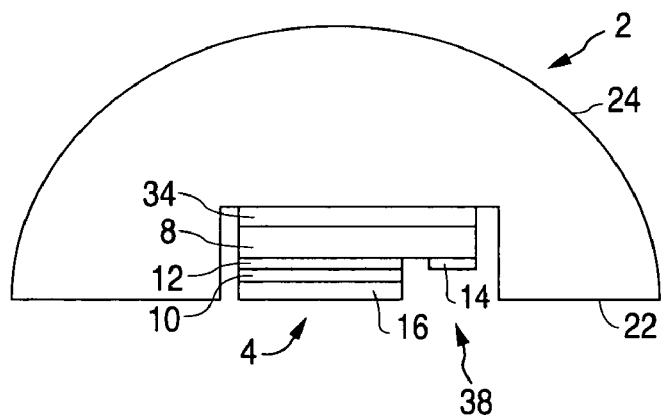
FIG. 10 is a schematic diagram of a light emitter located in a recess of a surface of an optical element to which it is directly bonded.
Figure 11:
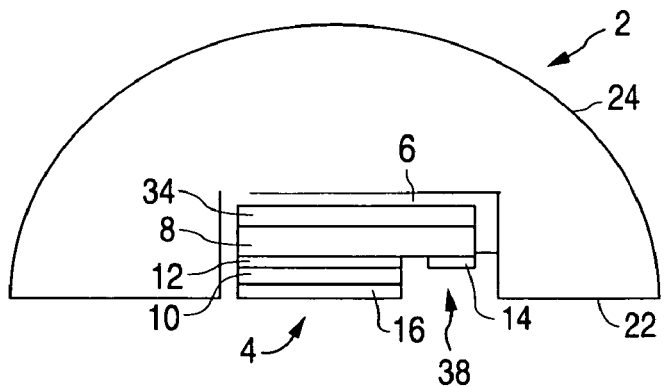
FIG. 11 is a schematic diagram of a light emitter located in a recess of a surface of an optical element to which it is bonded with a bonding layer.

FIGS. 10 and 11 illustrate embodiments where light emitter 4 is located in a recess 38 in surface 22 of optical element 2 to which light emitter 4 is bonded. In the embodiment illustrated in FIG. 10, optical element 2 is directly bonded to light emitter 4. In the embodiment of FIG. 11, optical element 2 is bonded to light emitter 4 with bonding layer 6.

Figure 12A:
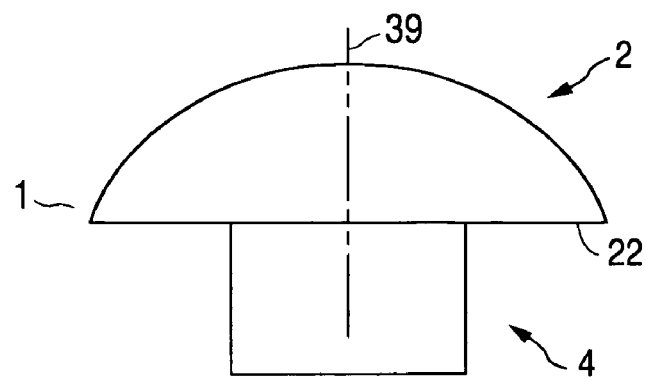
FIG. 12A is a schematic diagram of an optical element bonded to a light emitter in accordance with an embodiment of the present invention.
Figure 12B:
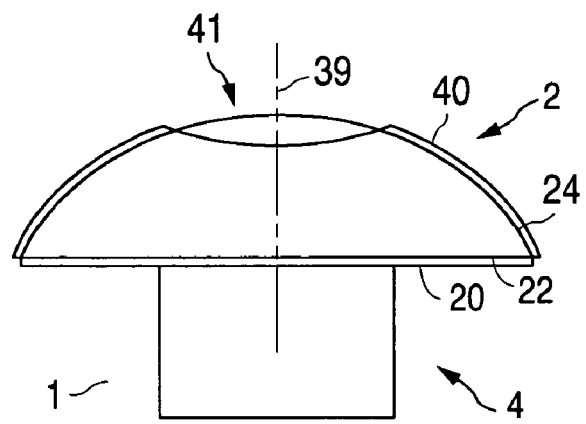
FIGS. 12B-C are schematic diagrams of optical elements bonded to light emitters, forming top-emitting devices in accordance with embodiments of the present invention.
Figure 12C:
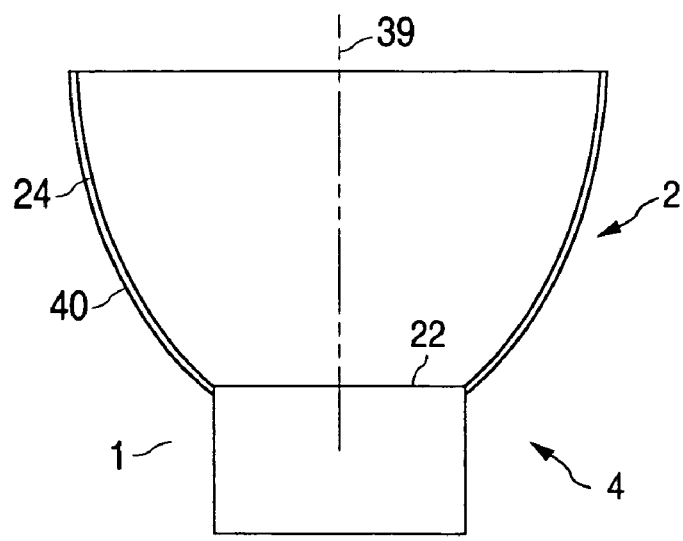

FIGS. 12A-13 illustrate top-emitter embodiments, adapted to direct the generated light through a top area of light emitter 4. FIGS. 12A-C illustrate cylindrical embodiments. In these embodiments a cross-section of optical element 2 with a plane parallel to the semiconductor layers of light emitter 4 is substantially a circle. Cylindrical embodiments have an axis 39, which is substantially perpendicular to the plane of the circle. In some embodiments axis 39 may not be perpendicular to the plane of the circle.

FIG. 12A illustrates a basic embodiment, where a dome shaped optical element 2 is bonded to light emitter 4 at surface 22.

FIG. 12B illustrates a top-emitter embodiment, adapted to direct the emitted light through a top area of the embodiment. In some embodiments a mirror layer 40 is formed on a substantial portion of surface 24 of optical element 2, leaving a smaller aperture 41 close to axis 39 of the embodiment. This embodiment narrows the light emitting surface, as preferred in some applications. The light of light emitter 4, which reaches aperture 41, leaves the embodiment through aperture 41. The light of light emitter 4, which reaches surface 24 where it is coated with mirror layer 40 may be reflected back into optical element 2. A portion of the reflected light reenters light emitter 4, where it can excite electrons and holes, which later may recombine to emit photons. This process is sometimes referred to as photon recycling. This recycled light may leave the embodiment through aperture 41. In some embodiments, aperture 41 can be anywhere on the surface of optical element 2. Optical element 2 is attached by a bond to light emitter 4 at surface 22. In some embodiments there is a metallization layer 20 on surface 22 to facilitate electrical connection to the top of light emitter 4, in other embodiments other contact solutions are used. The device of FIG. 12B is described in more detail in application Ser. No. 10/283,737, titled "Enhanced Brightness Light Emitting Device Spot Emitter," filed Oct. 29, 2002 and incorporated herein by reference.

Mirror layer 40 can be formed from a metallic layer, a dielectric, a reflective coating, or in general from any substantially reflective layer, which have a refractive index sufficiently different from the refractive index of optical element 2.

Figure 19:
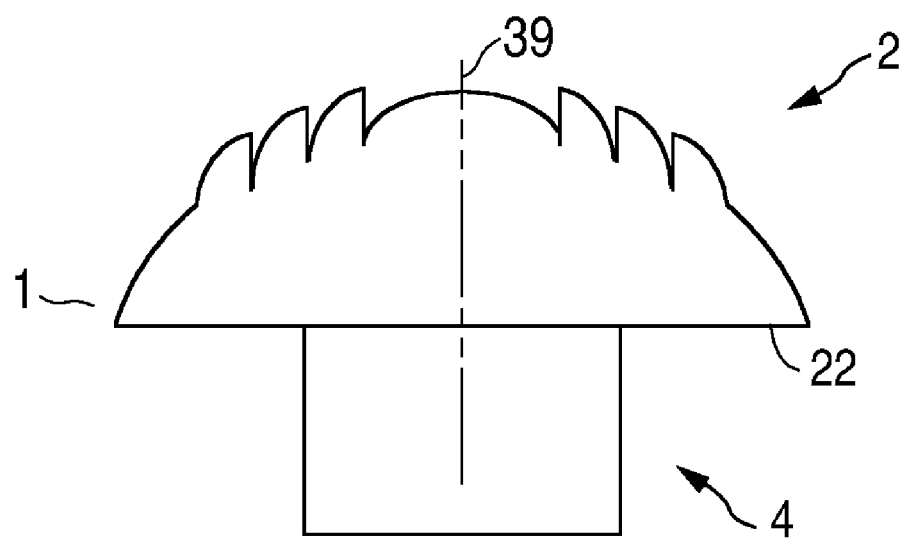
FIG 19 is schematic diagram of an optical element including grooves in the shape of a Fresnel lens bonded to a light emitter in accordance with an embodiment of present invention.

In both embodiments of FIGS. 12A-B optical element 2 may have a Fresnel pattern etched into it, as illustrated in FIG. 19. The Fresnel pattern includes a set of grooves, often arranged in concentric pattern. The Fresnel pattern can be etched on the whole surface 24, or only on the top region, or only on the side region of surface 24.

FIG. 12C illustrates another top-emitter embodiment. Here optical element 2 is an optical concentrator with optional mirror layer 40 formed on the sides of the concentrator. In some embodiments the shape of the optical concentrator is similar to a paraboloid. Although FIG. 12C depicts the optical concentrator as having a paraboloid shape, surface 24 may have any shape designed to concentrate light, such as a cone-shape or a beveled shape. The optical concentrator described here is also known in the field of non-imaging optics.

Figure 13A:
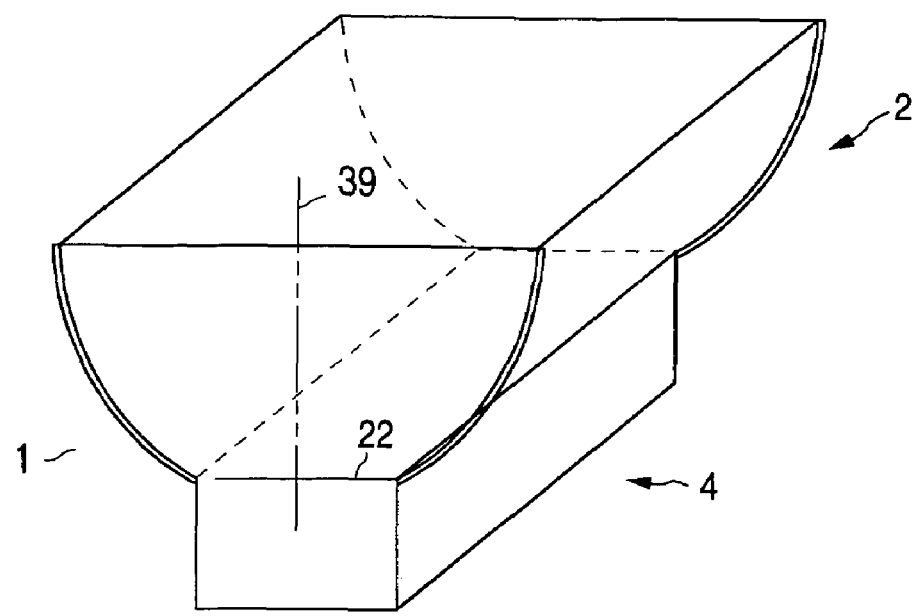
FIGS. 13A-B are schematic diagrams of elongated optical elements bonded to light emitters in accordance with embodiments of the present invention.
Figure 13B:
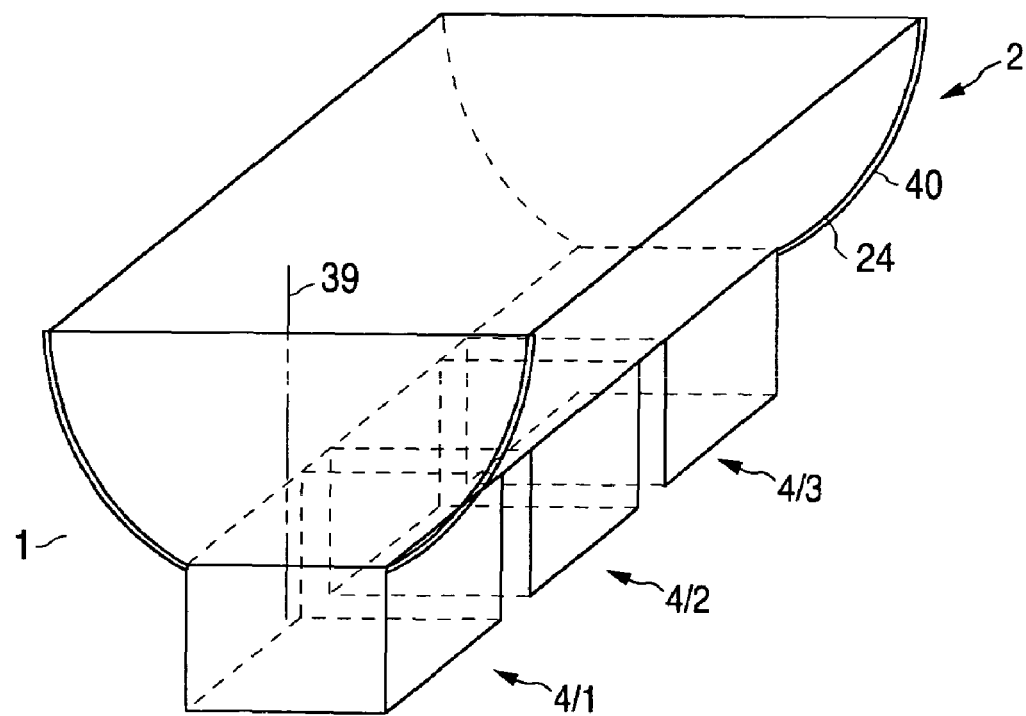

FIGS. 13A-B illustrate elongated embodiments. FIG. 13A illustrates an embodiment, where light emitter 4 is elongated and optical element 2 is correspondingly elongated. Optical element 2 is an optical concentrator. A cross section of the optical concentrator can be substantially a parabola. The cross sectional parabola has an axis 39. In some embodiments axis 39 can be substantially normal to surface 22. In embodiments with elongated parabolic optical concentrators the light emitted by light emitter 4 is directed substantially parallel to axis 39, after reflecting from mirror layer 40.

Although FIGS. 13A-B depict the optical concentrator as having a parabolic cross section, surface 24 may have any shape designed to concentrate light, such as elongated cone-shapes or beveled shapes.

FIG. 13B illustrates an elongated embodiment. In this embodiment multiple light emitters 4 are bonded to optical element 2. Light emitters 4 can be bonded to a bottom surface of shared optical element 2. Light emitters 4 can have similar or different characteristics. Some embodiments have light emitters 4 emitting light with different color.

Figure 14A:
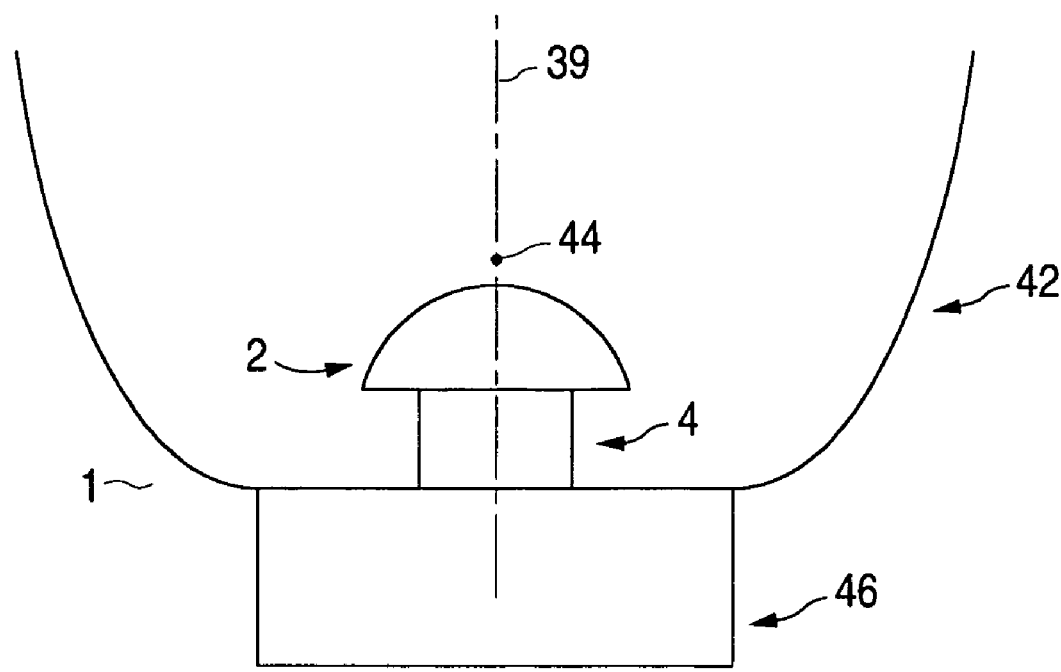
FIGS. 14A-B are schematic diagrams of optical elements bonded to light emitters and positioned in reflectors in accordance with embodiments of the present invention.

FIG. 14A illustrates an embodiment, where light emitter 4 is bonded to optical element 2, this assembly being disposed inside reflector 42. Reflector 42 is a structure adapted to direct the light towards a top surface of the optical element.

In some embodiments light emitting device 1 can be further coupled to a heat sink 46. There can be additional structures between light emitting device 1 and heat sink 46. Also, heat sink 46 can be disposed in many ways relative to reflector 42, different from the arrangement of FIG. 14A. Heat sink 46 can be formed from materials with good thermal conductance, for example, from metals or certain ceramics. Some embodiments utilize different methods for controlling the heat production of light emitter 4.

Figure 14B:
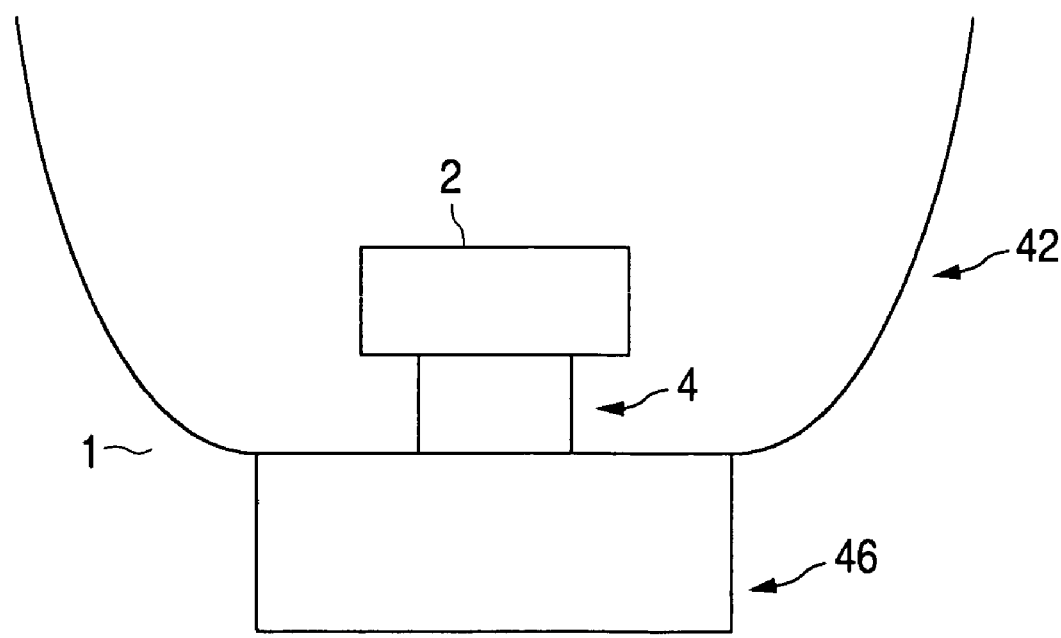

FIG. 14B illustrates a side-emitting embodiment. In this side-emitting embodiment optical element 2 is adapted to direct the emitted light at large angles relative to axis 39. This light, emitted at large angles, is then reflected by reflector 42. In this side-emitting embodiment light emitter 4 is once again bonded to optical element 2. In some embodiments light emitter 4 is also coupled to heat sink 46.

Figure 15C:
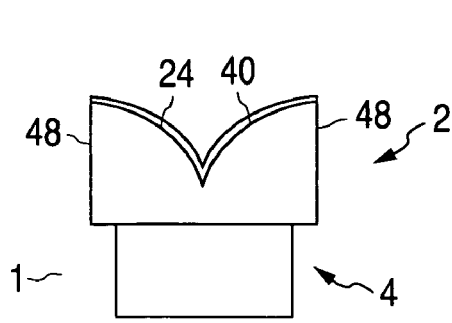
Figure 15C:
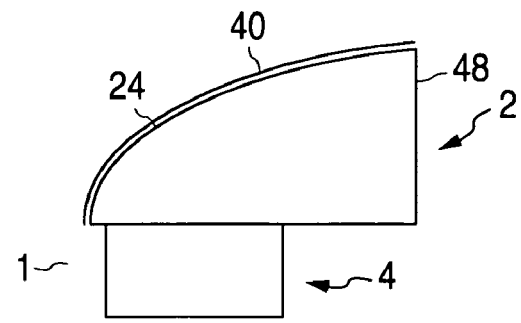
Figure 15C:
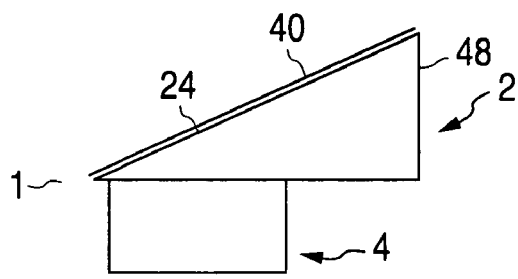

FIGS. 15A-C illustrate various side-emitting embodiments adapted to direct the light at large angles relative to axis 39.

FIG. 15A illustrates an embodiment, where optical element 2 has a cross section which is thinner in a central region than in a peripheral region. A substantial portion of surface 24 can be covered by mirror layer 40. The light emitted by light emitter 4 propagates towards mirror layer 40, where it can be reflected sideways. This reflected light can leave optical element 2 through sides 48. Embodiments with differently shaped surfaces 24 direct the reflected light differently. Embodiments where surface 24 has two half-parabola-like cross sections, direct the light substantially horizontally. In some embodiments optical element 2 is cylindrical, i.e. its cross section with a horizontal plane is essentially a circle.

FIG. 15B illustrates an embodiment with an asymmetric optical element 2. Mirror layer 40 on surface 24 reflects the light towards the right, so that the light can leave optical element 2 through right side 48. Surface 24 can be curved. Its cross section can be, for example, a parabola.

FIG. 15C illustrates an embodiment with an asymmetric optical element 2. Mirror layer 40 on surface 24 may reflect the light towards the right, so that the reflected light can leave optical element 2 through right side 48. Surface 24 can be essentially flat.

Figure 16:
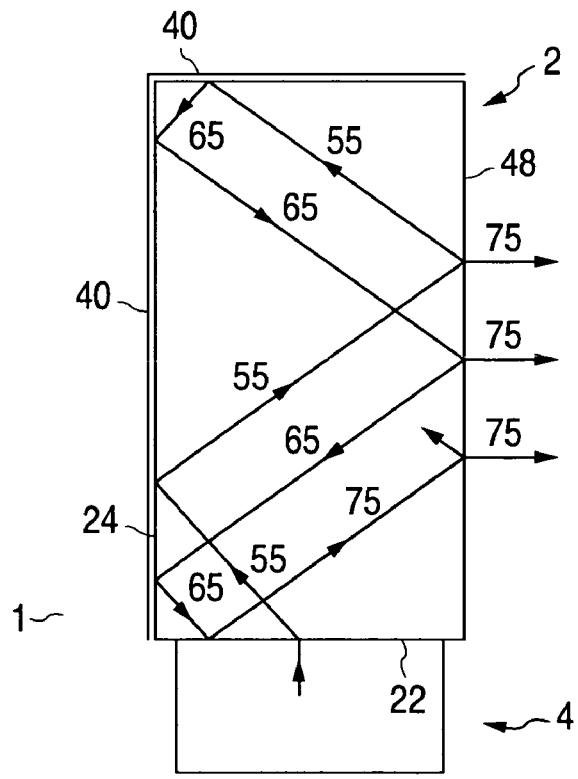
FIG. 16 is a schematic diagram of a column-like optical element bonded to a light emitter in accordance with embodiment of the present invention.

FIG. 16 illustrates an asymmetric elongated embodiment. Optical element 2 is shaped as a column or slab. In some embodiments mirror layer 40 is formed on the top of the column. In some embodiments a mirror layer 40 is formed on one of the sides 24 of the column. In some other embodiments no mirror layer formed on the sides. In some embodiments, a scattering layer is formed on the top of the column. The light rays enter optical element 2 through surface 22. Ascending light rays 55 and descending light rays 65 are repeatedly reflected by mirror layer 40 on the side and on the top. A portion of light rays 55 and 65, reaching right surface 48, exit as exiting light rays 75, an other portion is reflected. In the embodiments, where there is no mirror layer on any of the sides of optical element 2, light rays 55 and 65 may exit on any of the sides of the column like optical element 2. In embodiments, where there is no mirror layer of the top of the column, light rays 55 and 65 may exit also through the top of the column. Therefore, these embodiments can be used as a source of a "light-slab," "light-column," or "light-sheet." Such a light source can be used in a wide variety of applications.

Figure 17A:
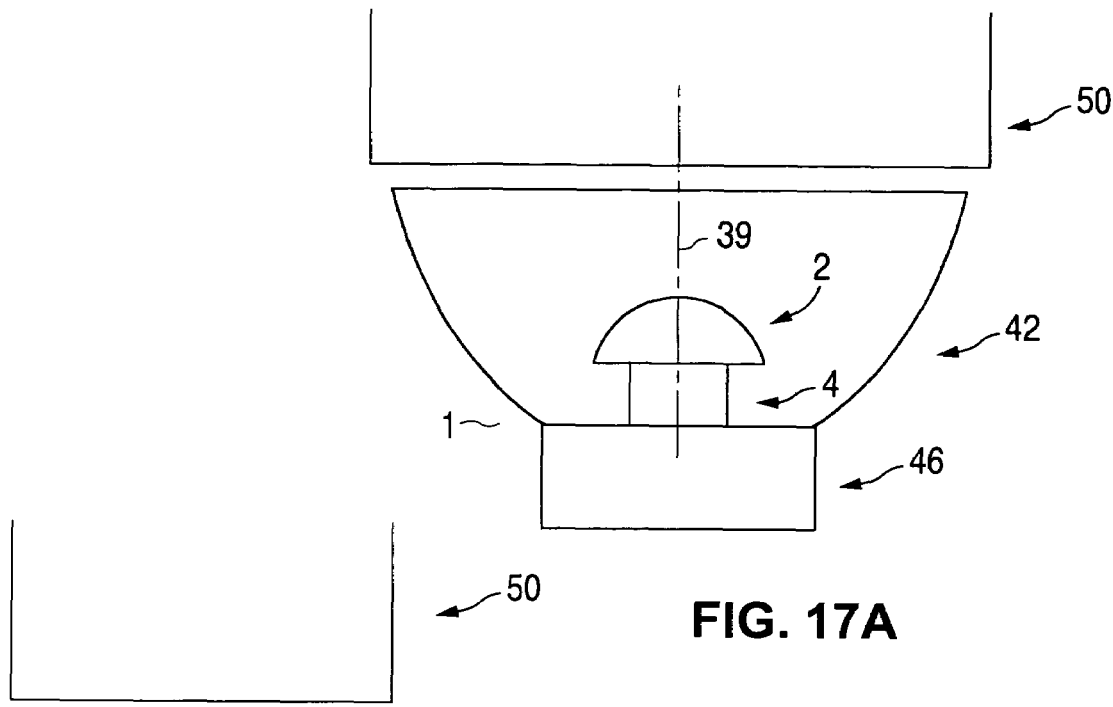
FIGS. 17A-C are schematic diagrams of optical elements bonded to light emitters and coupled to light guides in accordance with embodiments of the present invention.
Figure 17B:
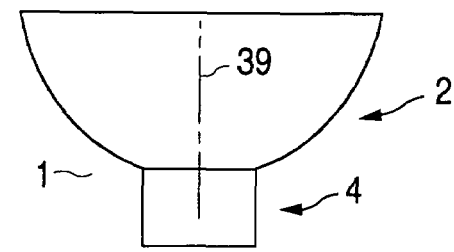
Figure 17C:
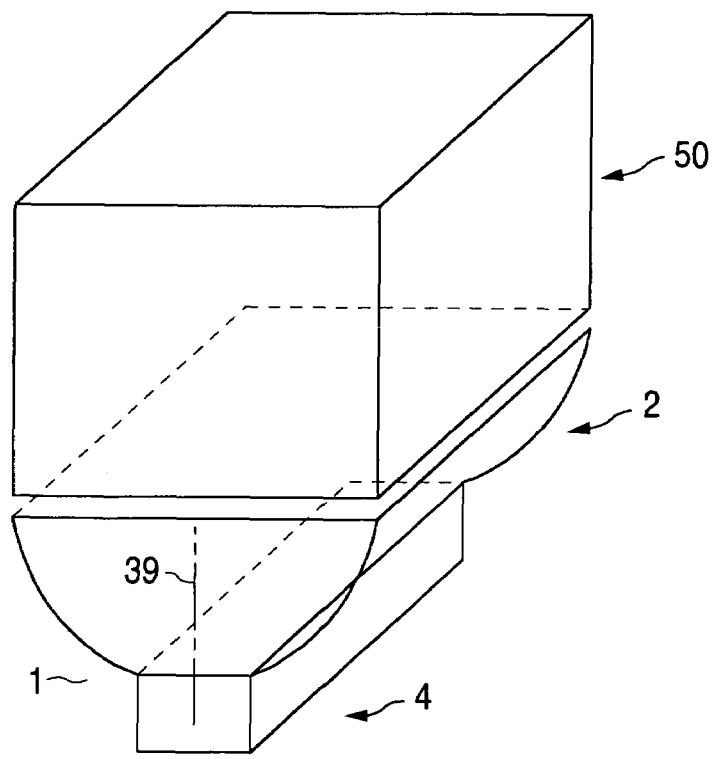

FIGS. 17A-C illustrate embodiments, where light emitting device 1 is positioned in the proximity of a light guide. Some light guides have a low index of refraction and can be made of, for example, Teflon, acrylic, or PMMA. Light guide 50 may be in contact with light emitting device 1 or can be spaced apart from light emitting device 1 with, for example, air, silicone, epoxy, one or more filters, or a coating such as an antireflective coating between light emitting device 1 and light guide 50. Light guides are capable of directing light to a far away target or application areas. Light guides can be incorporated into displays, such as indicators and liquid crystal displays. In all the subsequent light guide designs of FIGS. 17 and 18 any of the light emitting devices of FIGS. 1-16 can be utilized.

FIG. 17A illustrates an embodiment, where the designs of FIGS. 14A-B are positioned in the proximity of light guide 50, separated by air, silicone, or epoxy, for example. Reflector 42 directs the light towards light guide 50.

FIG. 17B illustrates an embodiment, where optical element 2 is an optical concentrator, as in the embodiment of FIG. 12C. In this embodiment the optical concentrator directs the light towards light guide 50.

FIG. 17C illustrates an embodiment, where optical element 2 is an elongated optical concentrator, as in the embodiments of FIGS. 13A-B. In this embodiment the elongated optical concentrator directs the light towards elongated light guide 50.

Figure 18:
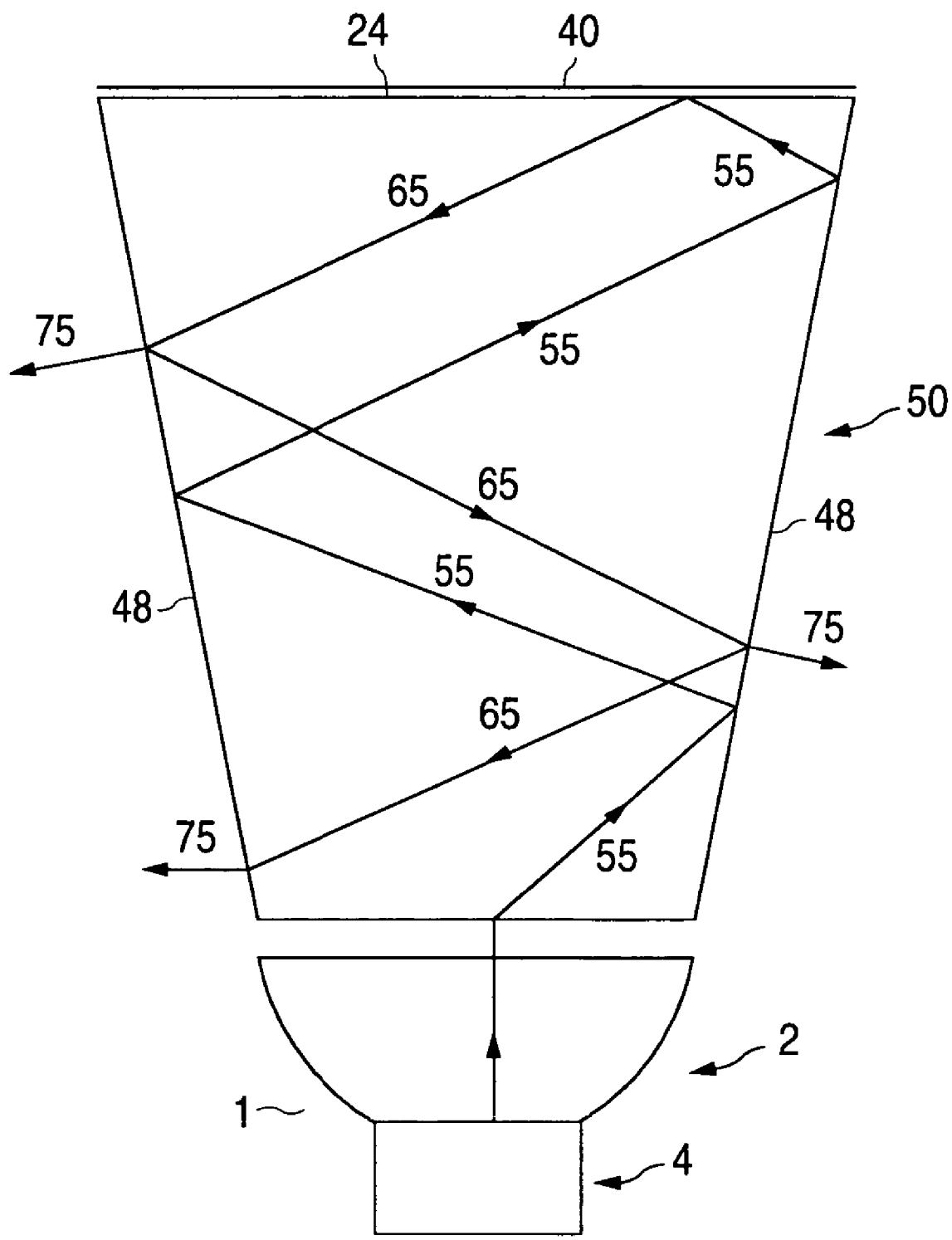
FIG. 18 is a schematic diagram of the path of light rays in a tapered light guide in accordance with an embodiment of the present invention.

FIG. 18 illustrates an embodiment, where light guide 50 has tapered side surfaces 48, broadening away from light emitting device 1. In some embodiments mirror layer 40 is formed at the end of light guide 50. In some embodiments a mirror layer 40 is formed on one of the sides 24 of light guide 50. In some embodiments no mirror layer is formed on the sides of light guide 50. In some embodiments, a scattering surface is formed at the end of light guide 50. Ascending light rays 55 are reflected or scattered into descending light rays 65 at the top mirror layer 40 or scattering surface.

The tapering angle can be small. Ascending light rays 55 can experience a total internal reflection (TIR) at sides 24 because of the broadening taper and stay within light guide 50. This extra path length can mix different colors of light. Returning light rays 65 do not experience TIR because they experience a narrowing taper. Therefore, at every reflection returning light rays 65 partially exit light guide 50 as exiting light rays 75. In these embodiments the repeatedly reflected light may be distributed sufficiently evenly that the intensity of exiting light rays 75 has a substantially uniform intensity along light guide 50, providing a sheet of light. In some embodiments only one of the sides may be tapered.

In some embodiments light guide 50 is coupled to the design of FIG. 13B, with two or more light emitting devices 4. In various embodiments light emitting devices with different colors can be employed. In some embodiments the two or more emitted colors are chosen so that they can combine into a color close to white. Some embodiments combine amber and blue, some cyan and red, and some combine red, blue and green. After repeated reflections from surfaces 48 of light guide 50 the rays of different colors become sufficiently mixed to appear as close to white light. Embodiments with such light guides can be applied as sources of a sheet of white light. Such a white sheet light source can be utilized, for example, for back-lighting in liquid crystal displays.

While the present invention is illustrated with particular embodiments, the invention is intended to include all variations and modifications falling within the scope of the appended claims.

We claim:

1. A device comprising:
   a semiconductor light emitting device comprising a stack of semiconductor layers including an active region;
   an optical element bonded to the semiconductor light emitting device; and
   a bonding layer disposed between the optical element and the semiconductor light emitting device;
   wherein the bonding layer comprises an oxide of tellurium.

2. The device of claim 1 wherein the semiconductor light emitting device comprises one of a substrate and a superstrate.

3. The device of claim 2 wherein the one of a substrate and a superstrate comprises a material selected from the group of sapphire, SiC, aluminum oxynitride, zirconia oxide, GaN, AlN, spinel, GaP, ZnS, an oxide of tellurium, an oxide of lead, an oxide of tungsten, and transparent alumina.

4. The device of claim 1 further comprising a plurality of grooves formed on the optical element.

5. The device of claim 1 wherein the optical element comprises a Fresnel lens.

6. The device of claim 1 further comprising a Fresnel lens formed on the optical element.

7. The device of claim 1 further comprising a reflective material formed on at least a portion of the optical element.

8. The device of claim 1 wherein the bonding layer has a softening temperature between about 250° C. and about 500° C.

9. The device of claim 1 wherein the shape of the optical element is one of a dome, a paraboloid, a cone-shape, and a beveled shape.

10. The device of claim 1 wherein the optical element comprises one or more luminescent materials, capable of converting a wavelength of light emitted by the stack of layers to at least another wavelength.

11. The device of claim 1 wherein a portion of the optical element is coated with one or more luminescent materials, capable of converting a wavelength of light emitted by the stack of layers to at least another wavelength.

12. The device of claim 1 wherein the bonding layer comprises one or more luminescent materials, capable of converting a wavelength of light emitted by the stack of layers to at least another wavelength.

13. The device of claim 1 wherein at least one surface of the stack of layers is beveled.

14. The device of claim 1 wherein a bottom surface of the optical element is substantially parallel to a growth direction of the stack of layers.

15. The device of claim 1 wherein a bottom surface of the optical element is substantially perpendicular to a growth direction of the stack of layers.

16. The device of claim 1 wherein the semiconductor light emitting device is bonded to the optical element in a flip chip orientation.

17. The device of claim 1 wherein the optical element comprises a material selected from the group of sapphire, SiC, aluminum oxynitride, zirconia oxide, GaN, AlN, spinel, GaP, ZnS, an oxide of tellurium, an oxide of lead, an oxide of tungsten, and transparent alumina.

* * * * *